United States Patent
Ernst et al.

(10) Patent No.: US 8,088,674 B2
(45) Date of Patent: Jan. 3, 2012

(54) METHOD OF GROWING, ON A DIELECTRIC MATERIAL, NANOWIRES MADE OF SEMI-CONDUCTOR MATERIALS CONNECTING TWO ELECTRODES

(75) Inventors: Thomas Ernst, Morette (FR); Thierry Baron, Saint-Egreve (FR); Pierre Ferret, Grenoble (FR); Pascal Gentile, Voiron (FR); Bassem Salem, Sassenage (FR)

(73) Assignees: Commissariat a l'Energie Atomique, Paris (FR); Centre National de al Recherche Scientifique, Paris (FR)

( * ) Notice: Subject to any disclaimer, the term of this patent is extended or adjusted under 35 U.S.C. 154(b) by 0 days.

(21) Appl. No.: 12/743,852

(22) PCT Filed: Nov. 27, 2008

(86) PCT No.: PCT/FR2008/001651
§ 371 (c)(1),
(2), (4) Date: May 20, 2010

(87) PCT Pub. No.: WO2009/098398
PCT Pub. Date: Aug. 13, 2009

(65) Prior Publication Data
US 2010/0273317 A1    Oct. 28, 2010

(30) Foreign Application Priority Data
Nov. 28, 2007  (FR) .................................. 07 08351

(51) Int. Cl.
*H01L 21/36* (2006.01)
(52) U.S. Cl. ........................ 438/479; 977/938

(58) Field of Classification Search .................. 977/938; 438/479
See application file for complete search history.

(56) References Cited

U.S. PATENT DOCUMENTS

| 7,109,072 B2 * | 9/2006 | Saito et al. ..................... 438/149 |
| 7,208,094 B2 | 4/2007 | Islam et al. |
| 2004/0232426 A1 * | 11/2004 | Graham et al. .................. 257/77 |
| 2007/0014151 A1 * | 1/2007 | Zhang et al. ............. 365/185.01 |
| 2007/0155064 A1 * | 7/2007 | Chen et al. ..................... 438/142 |

FOREIGN PATENT DOCUMENTS

| KR | 2002-0093270 | 12/2002 |
| WO | WO 2005/065425 A2 | 7/2005 |
| WO | WO 2005/072089 A2 | 8/2005 |
| WO | WO 2006/016914 A2 | 2/2006 |
| WO | WO 2006/083310 A2 | 8/2006 |

OTHER PUBLICATIONS

Zacharias et al., "Semiconductor Nanowires: From Self-Organization to Patterned Growth," *Small Journal*, 2006, vol. 2, No. 6, pp. 700-717, Wiley-VCH Verlag GmbH & Co.
International Search Report issued on Jul. 10, 2009 in International Application No. PCT/FR2008/001651 (with translation).

* cited by examiner

*Primary Examiner* — Thao Le
*Assistant Examiner* — Kimberly Trice
(74) *Attorney, Agent, or Firm* — Oliff & Berridge, PLC

(57) ABSTRACT

Electrodes made from metallic material are formed on a layer of dielectric material. A bottom layer of at least one of the electrodes constitutes a catalyst material in direct contact with the layer of dielectric material. Nanowires are grown by means of the catalyst, between the electrodes, parallel to the layer of dielectric material. The nanowires connecting the two electrodes are then made from single-crystal semi-conductor material and in contact with the layer of dielectric material.

8 Claims, 1 Drawing Sheet

METHOD OF GROWING, ON A DIELECTRIC MATERIAL, NANOWIRES MADE OF SEMI-CONDUCTOR MATERIALS CONNECTING TWO ELECTRODES

BACKGROUND OF THE INVENTION

The invention relates to a method for producing nanowires connecting two electrodes, the nanowires being made from single-crystal semi-conductor material, the method successively comprising on a layer of dielectric material:
formation of the electrodes,
growth of the nanowires, by means of a catalyst, between the electrodes, parallel to the layer of dielectric material.

STATE OF THE ART

Continuous improvement of the performances of microelectronic circuits requires the integration density of the elementary components of the circuits to be increased. Up to now, improvement of performances was achieved by constant miniaturization of the dimensions of the MOSFET transistor. The transistors are now of nanometric size and production thereof is meeting with a large number of technological difficulties. Quantum effects within the field effect transistor are no longer negligible and conventional microelectronics materials are no longer able to provide characteristics to match the required specifications. Alternative solutions are therefore proposed in order to continue to improve the performances of microelectronic circuits.

One of the most promising ways forward consists in using nano-objects and more precisely semiconducting nanowires. The nanowires can be used to form single-crystal channels of field effect MOS transistors.

The document WO-A-2006/083310 describes growth of silicon nanowires from a silicon-on-insulator substrate by wet etching. This approach presents the drawback of requiring the use of conventional photolithography methods to define the dimensions of the nanowires and the use of a single-crystal silicon substrate to obtain single-crystal nanowires. In this approach, only the thickness can be relatively well defined as it is the thickness of the initial substrate. The widthways dispersion is greater as it is linked to the dispersions of the etching and lithography methods used.

U.S. Pat. No. 7,208,094 B2 describes fabrication of single-crystal silicon bridges between two silicon electrodes. From a silicon-on-insulator substrate, two silicon electrodes are formed in conventional manner by photolithography and etching. Clusters of catalyst materials are then deposited on a vertical wall of one of the electrodes to enable growth of horizontal silicon nanowires between the opposite vertical walls of the electrodes. This method requires the formation of crystal silicon electrodes and therefore an initial single-crystal base. Furthermore, the clusters being annealed results in a large dispersion on the diameter of the nanowires.

These two approaches are incompatible with industrial integration of circuits comprising several levels of transistors one above the other. Formation of a second layer of single-crystal silicon does in fact require the use of technological resolidification or layer transfer methods having thermal budgets that may be incompatible with the transistors formed on a first layer of silicon. Furthermore, to produce a circuit the transistors have to be identical. Nanowires do however present a large dispersion in their dimensions (diameter, width, thickness) from one nanowire to the other which makes use thereof in a semi-conductor circuit impossible.

OBJECT OF THE INVENTION

The object of the invention is to provide a method for fabricating nanowires made of semi-conductor material of reproducible and perfectly well-defined diameter, this method being, easy to implement and having a limited heat budget.

According to the invention, this object is achieved by the appended claims and more particularly by the fact that the electrodes being made from metallic material, the catalyst is formed by a bottom layer of at least one of the electrodes, said bottom layer being directly in contact with the layer of dielectric material so that the nanowires formed are in contact with the layer of dielectric material, the nanowire having a required diameter equal to a thickness of the catalyst.

BRIEF DESCRIPTION OF THE DRAWINGS

Other advantages and features will become more clearly apparent from the following description of a particular embodiment of the invention given for non-restrictive example purposes only and represented schematically in cross-section in FIG. 1 (single FIGURE).

DESCRIPTION OF A PREFERRED EMBODIMENT OF THE INVENTION

Figure 1:
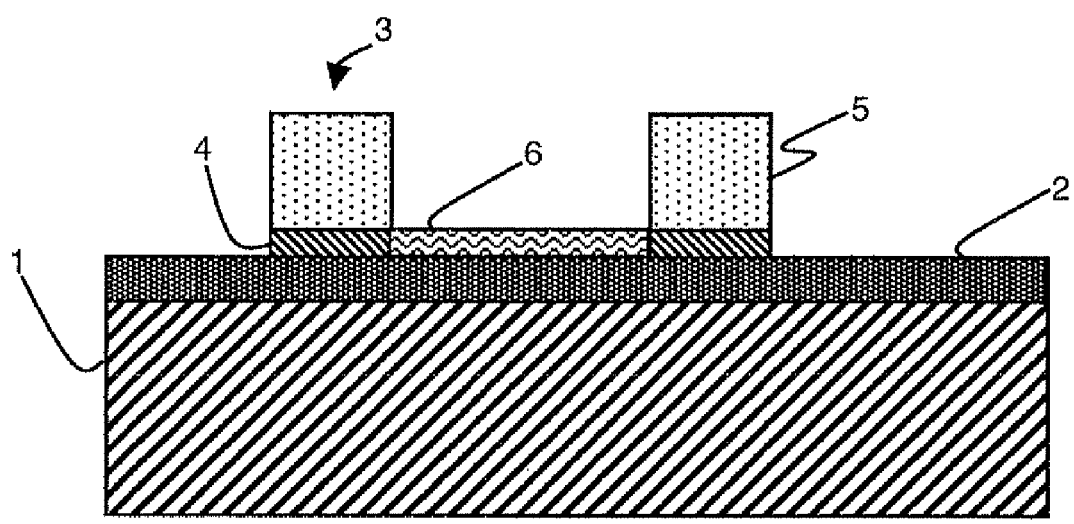

As illustrated in FIG. 1, two electrodes 3 made from metallic material are formed on a layer of dielectric material 2 of a substrate 1. Perpendicularly to substrate 1, electrodes 3 present substantially parallel opposite lateral surfaces (vertical in FIG. 1) between which the nanowires have to be formed.

Layer of dielectric material 2 is for example chosen from silicon oxide-based materials, silicon nitride-based materials, $HfO_2$-based materials and $Al_2O_3$-based materials. Substrate 1 is for example made from bulk silicon, but it can be made from glass or from any other material able to withstand the subsequent technological steps. If substrate 1 is made from dielectric material, layer 2 can be integrated in substrate 1. Substrate 1 can for example comprise transistors forming integrated circuits encapsulated in layer of dielectric material 2.

A layer of catalyst material 4, in contact with layer of dielectric material 2, is formed by a bottom layer of at least one of the two electrodes 3. Catalyst layer 4 is made from metallic material, for example chosen from Au, Al, Fe, Ti, PtSi, NiSi, or Cu. Electrodes 3 advantageously each comprise a contact layer 5 that is located above the bottom layer of catalyst material 4. Contact layer 5 and catalyst layer 4 are made from different materials. Contact layer 5 is preferably made from aluminum or copper.

Catalyst layer 4 can be deposited by any suitable technique, for example by cathode sputtering, evaporation or chemical vapor deposition. Localization of catalyst layer 4 can be performed at the same time as formation of the electrodes or after formation of electrodes 3, for example by photolithography and etching or by lift-off.

In conventional manner, a masking layer (not shown) can be used to delineate electrodes 3, in particular the opposite lateral surfaces of their bottom layers 4.

Growth of nanowires 6 is then performed from catalyst 4 of at least one of electrodes 3, parallel to layer of dielectric material 2. Growth of single-crystal nanowires 6 made from semi-conductor material is performed in conventional manner by any suitable technique, for example by chemical vapor deposition, or molecular beam epitaxy, until they connect the opposite surfaces of the two electrodes 3 at their bottom part. Bottom layer of catalyst material 4 being in direct contact with layer of dielectric material 2, nanowires 6 thus formed are in contact with layer of dielectric material 2.

The presence of layer of dielectric material 2 in contact with layer of catalyst material 4 means that, when it is grown, nanowire 6 remains in contact with layer of dielectric material 2. Growth of the nanowire is therefore substantially horizontal in FIG. 1 instead of having an almost vertical growth as in prior-art methods. This shortcoming was circumvented in U.S. Pat. No. 7,208,094 by imposing the crystal structure of nanowires 6 from crystal silicon electrodes.

The thickness and width of nanowires 6 are linked to the thickness and width of catalyst material layer 4, nanowires 6 being cylinders with a diameter that is equal to the thickness of layer of catalyst material 4. Moreover, to form two nanowires 6, it is not necessary to have two free surfaces made from catalyst material separated by a non-reactive surface on one and the same electrode 3. The width of layer of catalyst material 4 controls the number of nanowires 6 made between the electrodes. It is then possible to grow one nanowire 6 or more by simply modulating the surface facing the electrodes. The diameter of nanowires 6 being equal to the thickness of layer of catalyst material 4, the dispersion on the diameter of the nanowires is directly linked to the dispersion on the thickness of the catalyst material. As the deposition methods are very reproducible over several substrates and have a small dispersion on any one substrate, the required diameter of the nanowires is well controlled. This embodiment is particularly advantageous for its implementation as the diameter of the semi-conductor material nanowires is directly linked to the thickness of the catalyst material. This advantage cannot be obtained with carbon nanotubes as the latter present a large dispersion in their diameters. When growth takes place, their diameter is in fact decorrelated from the thickness of their initial catalyst material.

The article by M. Zacharias et al. "Semiconductor Nanowires: From Self-Organization to Patterned Growth", Small Journal 2006, 2, No. 6, pp 700-717 describes different materials that are able to be used for growth of the nanowires and the corresponding techniques.

Nanowires 6 are preferably made from silicon, germanium or an alloy of these materials. If the nanowires are made from silicon, growth thereof is preferably performed by chemical vapor deposition, for example at a temperature of 400° C. under a pressure of 20 mbar and with flow rates of silane ($SiH_4$) and hydrogen ($H_2$) respectively of 50 sccm (standard cubic centimeters per minute) and 3.7 slm (standard liters per minute).

For example purposes, with a catalyst material 4 made from gold having a thickness equal to 20 nm, growth of silicon nanowires is achieved by chemical vapor deposition at a temperature of 450° C. under a pressure of 20 mbar and with flow rates of silane ($SiH_4$) and hydrogen ($H_2$) respectively of 50 sccm (standard cubic centimeters per minute) and 3.7 slm (standard liters per minute). The nanowires have a final thickness equal to 20 nm.

Nanowires 6 made from not intentionally doped semiconductor material can be produced. These nanowires can subsequently be doped by conventional implantation techniques. However, by modifying the growth conditions, it is also possible to form p-doped or n-doped nanowires 6 and nanowires presenting one type of doping and then the other, or even an alternation of these dopings on one and the same nanowire 6.

Different architectures of electrodes 3 are possible. Nanowires 6 can be grown from a single lateral surface of electrode 3. However, growth can be performed from several free lateral surfaces of an electrode 3 in order to connect this electrode 3 to a plurality of other electrodes.

It is then possible in an alternative embodiment to form more than two electrodes, for example 3 electrodes that are connected to one another by nanowires 6 in a predefined design. Growth of nanowires 6 can be performed from several lateral surfaces of one of electrodes 3, respectively opposite a surface of another electrode.

The method for growing nanowires 6 described above can advantageously be used for producing field effect transistors in which electrodes 3 constitute the source and drain electrodes, nanowire 6 forming the transistor channel on layer of insulating material 2. The gate electrode is subsequently fabricated in conventional manner above the channel formed by nanowire 6. It is thus possible, on an insulator, to produce transistors having a channel made from single-crystal semiconductor material obtained by direct localized growth without a continuous crystal contact with a crystal substrate or without the use of crystal layer transfer.

Transistors, logic architectures, or volatile or non-volatile memories can then be produced above a structure already containing transistors that have been encapsulated by a layer of dielectric material. This technique is then particularly advantageous for producing architectures called 3D architectures comprising several levels of transistors arranged above one another and conventionally separated by a layer of dielectric material.

The invention claimed is:

1. A method of growing a nanowire made from single-crystal semi-conductor material, comprising successively:
providing a substrate with two electrodes made from metallic material on a layer of dielectric material, one of the electrodes comprising a layer of catalyst directly in contact with the layer of dielectric material; and
growing the nanowire made from single-crystal semi-conductor material by means of the catalyst, the nanowire growing in contact with the dielectric material and with a diameter equal to a thickness of the layer of catalyst.

2. The method according to claim 1, wherein the electrode comprises a contact layer above the bottom layer of catalyst material.

3. The method according to claim 1, wherein the catalyst material is chosen from Au, Al, Fe, Ti, PtSi, NiSi or Cu.

4. The method according to claim 2, wherein the bottom layer of catalyst material and the contact layer are made from different materials.

5. The method according to claim 4, wherein the contact layer is made from aluminum or copper.

6. The method according to claim 1, wherein the layer of dielectric material is chosen from silicon oxide-based materials, silicon nitride-based materials, HfO2-based materials and Al2O3-based materials.

7. The method according to claim 1, wherein the nanowires are made from silicon.

8. A method of growing a nanowire made from single-crystal semi-conductor material, comprising successively:
providing a substrate with electrodes made from metallic material on a layer of dielectric material, the electrodes comprising a layer of catalyst directly in contact with the layer of dielectric material, and a contact layer partially covering the layer of catalyst; and
growing the nanowire made from single-crystal semi-conductor material by means of the catalyst, the nanowire growing in contact with the dielectric material and with a diameter equal to a thickness of the layer of catalyst.

* * * * *